United States Patent
Plihal et al.

(10) Patent No.: US 11,237,119 B2
(45) Date of Patent: Feb. 1, 2022

(54) DIAGNOSTIC METHODS FOR THE CLASSIFIERS AND THE DEFECTS CAPTURED BY OPTICAL TOOLS

(71) Applicant: KLA-Tencor Corporation, Milpitas, CA (US)

(72) Inventors: Martin Plihal, Pleasanton, CA (US); Erfan Soltanmohammadi, Campbell, CA (US); Saravanan Paramasivam, Chennai (IN); Sairam Ravu, Chennai (IN); Ankit Jain, Ballston Spa, NY (US); Prasanti Uppaluri, Saratoga, CA (US); Vijay Ramachandran, Sunnyvale, CA (US)

(73) Assignee: KLA-Tencor Corporation, Milpitas, CA (US)

(*) Notice: Subject to any disclaimer, the term of this patent is extended or adjusted under 35 U.S.C. 154(b) by 608 days.

(21) Appl. No.: 15/835,399

(22) Filed: Dec. 7, 2017

(65) Prior Publication Data
US 2018/0197714 A1    Jul. 12, 2018

Related U.S. Application Data

(60) Provisional application No. 62/444,694, filed on Jan. 10, 2017, provisional application No. 62/475,030, (Continued)

(51) Int. Cl.
*G01N 21/95* (2006.01)
*H01L 21/67* (2006.01)
(Continued)

(52) U.S. Cl.
CPC ..... *G01N 21/9501* (2013.01); *G01N 21/8851* (2013.01); *G05B 19/41875* (2013.01);
(Continued)

(58) Field of Classification Search
None
See application file for complete search history.

(56) References Cited

U.S. PATENT DOCUMENTS

| | | | | |
|---|---|---|---|---|
| 5,539,752 A | * | 7/1996 | Berezin | H01L 22/20 257/E21.525 |
| 5,898,491 A | * | 4/1999 | Ishiguro | H01L 22/34 356/243.4 |

(Continued)

FOREIGN PATENT DOCUMENTS

WO    WO-2007120279 A2 * 10/2007 ............. G06T 7/001

OTHER PUBLICATIONS

Lapedus M.; "Finding Defects is Getting Harder"; article published on https://semiengineering.com/finding-killer-defects/; published Sep. 17, 2015 (Year: 2015).*

(Continued)

*Primary Examiner* — Catherine T. Rastovski
*Assistant Examiner* — Leonard S Liang
(74) *Attorney, Agent, or Firm* — Hodgson Russ LLP

(57) ABSTRACT

Wafer inspection with stable nuisance rates and defect of interest capture rates are disclosed. This technique can be used for discovery of newly appearing defects that occur during the manufacturing process. Based on a first wafer, defects of interest are identified based on the classified filtered inspection results. For each remaining wafer, the defect classifier is updated and defects of interest in the next wafer are identified based on the classified filtered inspection results.

17 Claims, 11 Drawing Sheets

Related U.S. Application Data filed on Mar. 22, 2017, provisional application No. 62/581,378, filed on Nov. 3, 2017.

(51) Int. Cl.

| | |
|---|---|
| *G05B 19/418* | (2006.01) |
| *G01N 21/88* | (2006.01) |
| *G06T 7/00* | (2017.01) |
| *H01J 37/22* | (2006.01) |
| *H01J 37/28* | (2006.01) |
| *G01N 23/04* | (2018.01) |
| *H01L 21/66* | (2006.01) |
| *G06N 7/00* | (2006.01) |

(52) U.S. Cl.
CPC ............ *G06T 7/001* (2013.01); *G06T 7/0004* (2013.01); *G01N 23/04* (2013.01); *G05B 2219/32186* (2013.01); *G05B 2219/32196* (2013.01); *G06N 7/005* (2013.01); *H01J 37/222* (2013.01); *H01J 37/28* (2013.01); *H01J 2237/22* (2013.01); *H01J 2237/2817* (2013.01); *H01L 21/67288* (2013.01); *H01L 22/20* (2013.01)

(56) References Cited

U.S. PATENT DOCUMENTS

| | | | | |
|---|---|---|---|---|
| 5,946,213 A * | 8/1999 | Steffan | ............. | H01L 22/20 |
| | | | | 700/110 |
| 5,991,699 A * | 11/1999 | Kulkarni | ............. | H01L 22/20 |
| | | | | 257/E21.525 |
| 6,035,244 A * | 3/2000 | Chen | ............. | G06F 11/2268 |
| | | | | 700/110 |
| 6,091,846 A * | 7/2000 | Lin | ............. | G01N 21/9501 |
| | | | | 257/E21.525 |
| 6,122,397 A * | 9/2000 | Lee | ............. | G06T 7/001 |
| | | | | 382/141 |
| 6,148,099 A * | 11/2000 | Lee | ............. | G06T 7/0006 |
| | | | | 382/145 |
| 6,205,239 B1 * | 3/2001 | Lin | ............. | G01N 21/95607 |
| | | | | 257/E21.525 |
| 6,246,472 B1 * | 6/2001 | Yoda | ............. | G01N 21/956 |
| | | | | 356/237.2 |
| 6,246,787 B1 * | 6/2001 | Hennessey | ....... | G01N 21/95607 |
| | | | | 250/559.45 |
| 6,256,093 B1 | 7/2001 | Ravid et al. | | |
| 6,292,582 B1 * | 9/2001 | Lin | ............. | G01N 21/95607 |
| | | | | 257/E23.179 |
| 6,303,394 B1 * | 10/2001 | Steffan | ............. | H01L 22/20 |
| | | | | 257/E21.525 |
| 6,476,388 B1 * | 11/2002 | Nakagaki | ............. | G01N 23/225 |
| | | | | 250/306 |
| 6,519,357 B2 * | 2/2003 | Takeuchi | ............. | G06T 7/001 |
| | | | | 348/87 |
| 7,103,505 B2 * | 9/2006 | Teshima | ............. | H01J 37/28 |
| | | | | 700/121 |
| 7,283,659 B1 * | 10/2007 | Bakker | ............. | G06K 9/6254 |
| | | | | 382/144 |
| 7,570,797 B1 * | 8/2009 | Wang | ............. | G01N 21/9501 |
| | | | | 250/559.45 |
| 7,676,077 B2 * | 3/2010 | Kulkarni | ............. | G06F 17/5045 |
| | | | | 382/144 |
| 8,331,651 B2 * | 12/2012 | Nishiura | ............. | G06K 9/6255 |
| | | | | 382/149 |
| 9,280,814 B2 * | 3/2016 | Hirai | ............. | G06T 7/0004 |
| 9,293,298 B2 * | 3/2016 | Lauber | ............. | H01L 22/12 |
| 9,714,905 B1 * | 7/2017 | Plihal | ............. | G05B 19/41875 |
| 10,466,181 B2 * | 11/2019 | Honda | ............. | G01N 21/8806 |
| 2001/0016061 A1 * | 8/2001 | Shimoda | ............. | G06T 7/0004 |
| | | | | 382/149 |
| 2003/0109952 A1 * | 6/2003 | Hosoya | ............. | G06T 7/41 |
| | | | | 700/110 |
| 2004/0038455 A1 * | 2/2004 | Seligson | ............. | G03F 7/705 |
| | | | | 438/122 |
| 2004/0218806 A1 * | 11/2004 | Miyamoto | ............. | G06T 7/0004 |
| | | | | 382/145 |
| 2005/0177264 A1 | 8/2005 | Lin et al. | | |
| 2006/0215902 A1 * | 9/2006 | Shibuya | ............. | G01N 21/95607 |
| | | | | 382/149 |
| 2006/0265145 A1 * | 11/2006 | Huet | ............. | G01R 31/2846 |
| | | | | 702/35 |
| 2007/0230770 A1 * | 10/2007 | Kulkarni | ............. | G06F 17/5045 |
| | | | | 382/149 |
| 2007/0288219 A1 * | 12/2007 | Zafar | ............. | G03F 1/84 |
| | | | | 703/14 |
| 2008/0250384 A1 * | 10/2008 | Duffy | ............. | G03F 7/70525 |
| | | | | 716/55 |
| 2008/0292176 A1 * | 11/2008 | Sakai | ............. | G06T 7/001 |
| | | | | 382/144 |
| 2009/0080759 A1 * | 3/2009 | Bhaskar | ............. | G06T 7/001 |
| | | | | 382/141 |
| 2011/0320149 A1 * | 12/2011 | Lee | ............. | G01N 21/9501 |
| | | | | 702/83 |
| 2012/0229618 A1 * | 9/2012 | Urano | ............. | G01N 21/9501 |
| | | | | 348/92 |
| 2014/0050389 A1 | 2/2014 | Mahadevan et al. | | |
| 2015/0179400 A1 * | 6/2015 | Lauber | ............. | H01L 22/12 |
| | | | | 250/307 |
| 2016/0163035 A1 * | 6/2016 | Chang | ............. | G06K 9/4628 |
| | | | | 382/149 |
| 2016/0258879 A1 | 9/2016 | Liang et al. | | |
| 2016/0274036 A1 * | 9/2016 | Plihal | ............. | G03F 7/7065 |
| 2017/0082555 A1 * | 3/2017 | He | ............. | G06N 20/00 |
| 2018/0106732 A1 * | 4/2018 | Plihal | ............. | G01N 21/55 |

OTHER PUBLICATIONS

Simple guide to confusion matrix terminology; article published on https://www.dataschool.io/simple-guide-to-confusion-matrix-terminology/ (Year: 2014).*

Merriam-Webster online dictionary definition of "engine" (https://www.merriam-webster.com/dictionary/engine) (Year: 2019).*

ISA/KR, International Search Report for PCT/US2018/012684 dated Jun. 27, 2018.

\* cited by examiner (a)

(b)

(a)

(b)

(c)

(a)

(b)

DIAGNOSTIC METHODS FOR THE CLASSIFIERS AND THE DEFECTS CAPTURED BY OPTICAL TOOLS

CROSS-REFERENCE TO RELATED APPLICATIONS

This application claims priority to U.S. Provisional Application No. 62/444,694 filed on Jan. 10, 2017, U.S. Provisional Application No. 62/475,030 filed on Mar. 22, 2017, and U.S. Provisional Application No. 62/581,378 filed Nov. 3, 2017, the disclosures of which are incorporated herein by reference.

FIELD OF THE DISCLOSURE

The present disclosure relates to defect detection.

BACKGROUND OF THE DISCLOSURE

Evolution of the semiconductor manufacturing industry is placing ever greater demands on yield management and, in particular, on metrology and inspection systems. Critical dimensions are shrinking while wafer size is increasing. Economics is driving the industry to decrease the time for achieving high-yield, high-value production. Thus, minimizing the total time from detecting a yield problem to fixing it determines the return-on-investment for the semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Algorithms can be used to detect defects on a wafer. When machine learning algorithms are used to create defect classifiers and nuisance filters, the algorithms tend to be considered as black box solutions that are not tuned or diagnosed. Assessment of an inspection recipe typically waited until observing a new set of labeled data received for the assessment or, alternatively, not using some part of the labeled data and reserving it for the validation. Both of these techniques wasted resources.

When setting up an inspection recipe, the overall performance assessment may be done based on the quality of the data used to train the classifier and the classifier's ability to learn and extract the information from the data. If the quality of the data is poor and the real defects and nuisance do not have a clear separation boundary, then any classifier will likely fail.

The performance of each recipe is evaluated using two measures: discriminability and reliability. There are many discriminability measures. One is the confusion matrix of the training data, which consists of a set of conditional error rates. From these conditional error rates, the cap rate and nuisance rate may be important to semiconductor manufacturers. Cap rate is the ratio of the number of defects of interest (DOI) that are classified correctly to the total number of DOI in the wafer. The nuisance rate is the number of nuisance that are classified as DOI to the total number of defects that are classified as DOI. A higher cap rate and a lower nuisance rate mean a better recipe. However, nuisance rate and cap rate could only previously be evaluated for the training data set that included the actual labels of data.

Reliability is a measure that shows how certain the classifier is about the decision it makes. It is a function of the estimation of posteriors done by the classifier. Previously, the classifier reliability was evaluated through the confidence calculation for each defect.

Although discriminability and reliability can be important measures, discriminability and reliability can cover up the reality if the underlying distributions of DOI and nuisance have certain characteristics. This can be referred to as a shadowing effect.

Commonly used approaches for the classifier assessment on broad band plasma (BBP) and laser scanning (LS) tools are based on the confusion matrix of the training set, which is used to measure discriminability, and calculating the confidence histogram, which is used to measure the reliability. As seen in FIG. 1(a), the discriminability is only measured based on the training data, which is biased if any special sampling method being used. The confidence histogram has been used to measure reliability. There may be no information for a user about the reliability for the DOI or the nuisance classes using this technique.

Using the confusion matrix of the training set typically is not sufficient to understand the behavior of the recipe on the entire wafer. If the defects in the training set have been selected in certain way (which normally is done in order to reduce the number of defects for scanning electron microscope (SEM) review and manual classification), then the confusion matrix of the training set is biased toward those defects and is not be a good estimator of the classifier performance over the entire wafer.

Previous solutions retrain a binary classifier (e.g., nuisance vs. DOI) based on manual classification obtained during process monitoring (production sampling). These previous solutions used the updated classifier to create new DOI/nuisance separation on the subsequent wafer and used the new bins to generate production sample, which in turn was used to tune the next classifier. 50% of the previous solutions' sample is random sampling from the DOI bin of the latest classifier, and the other 50% is random sampling from the entire population. The two samples are used to compare the statistical process control (SPC) of the two inspections, and the second sample also provides "sub-threshold" defects to be used for retraining of the classifier.

Another previous method for dealing with process/wafer variations relied on building the classifier from scratch and iteratively building the training set with the aid of the SEM automatic defect classification (ADC), and then generating production samples from the new created DOI bin. However, the need to create a classifier from scratch on each wafer is more costly in terms of the SEM tool time. In addition, the ground truth for training the BBP model is based on SEM ADC without human verification, which makes the ground truth potentially less reliable. Lastly, this method does not leverage defects from previous wafers and, thus, increases the risk of data insufficiency and instability during the training process.

Previous techniques do not find the estimation of the cap rate and nuisance rate on the entire wafer (and for the unlabeled data) without additional sampling. Thus, the user does not know how tuning the recipe can affect the overall performance Previous techniques also do not identify the shadowing effect. Therefore, a new defect detection technique and system is needed.

BRIEF SUMMARY OF THE DISCLOSURE

In a first embodiment, a system for detecting defects of interest in a plurality of wafers is provided. The system comprises a central storage media configured to store a plurality of classified inspection results and an initial defect classifier; a wafer inspection tool; an image data acquisition system; and a processor in electronic communication with the central storage media, the wafer inspection tool, and the image data acquisition system. The processor is configured to execute the instructions of: an inspection engine; a sampling engine, and a tuning engine. The inspection engine instructs the processor to receive inspection results of a first wafer from the wafer inspection tool. The sampling engine instructs the processor to: retrieve the initial defect classifier from the central storage media; filter the inspection results based on the initial defect classifier; review locations of interest on the first wafer from the image data acquisition system based on the filtered inspection results; classify the filtered inspection results based on the initial defect classifier; store the classified filtered inspection results in the central storage media; and identify defects of interest in the first wafer based on the classified filtered inspection results. The tuning engine instructs the processor to update the initial defect classifier based on the stored classified filtered inspection results in the central storage media. For each remaining wafer, the inspection engine instructs the processor to receive inspection results of a next wafer from the wafer inspection tool. For each remaining wafer, the sampling engine instructs the processor to: filter the inspection results of the next wafer based on the initial defect classifier; review locations of interest on the next wafer, using the image data acquisition system based on the filtered inspection results of the next wafer and historical analysis sampling; classify the filtered inspection results of the next wafer based on the reviewed locations of interest on the next wafer; store the classified filtered inspection results for the next wafer in the central storage media; update the defect classifier, using the processor, based on the stored classified filtered inspection results for the next wafer in the central storage media; and identify defects of interest in the next wafer based on the classified filtered inspection results for the next wafer.

For each of the remaining wafers, the tuning engine can instruct the processor to update the defect classifier, using the processor, based on the stored classified filtered inspection results for the next wafer in the central storage media. The sampling engine can instruct the processor to perform the filtering step based on the updated defect classifier.

The image data acquisition system can be an SEM review tool.

The wafer inspection tool can perform a hot scan to capture inspection results. For example, the wafer inspection tool can be a broadband plasma inspection tool.

The defect classifier can send defect of interest data and nuisance data for retraining of the defect classifier.

The step of identifying defects of interest can comprise: sampling near a classification boundary of a most recent defect classifier; obtaining information about classifier stability based on fluctuations in the defect classifier; observing a movement in the classification boundary; and identifying the defects of interest based on the predicted movement in the classification boundary.

The inspection results or reviewed locations of interest can be stored in the central storage media.

In a second embodiment, a method for identifying defects of interest in a plurality of wafers is provided. The method comprises receiving, at a processor, inspection results of a first wafer from a wafer inspection tool. Using the processor, the inspection results are filtered based on an initial defect classifier. Locations of interest on the first wafer are reviewed, using an image data acquisition system, based on the filtered inspection results. The filtered inspection results are classified, using the processor, based on the reviewed locations of interest on the first wafer. The classified filtered inspection results are stored in a central storage media. Defects of interest in the first wafer are identified based on the classified filtered inspection results. For each remaining wafer, the method comprises receiving, at the processor, inspection results of a next wafer from the wafer inspection tool. Using the processor, the inspection results are filtered based on the initial defect classifier. Locations of interest on the next wafer are reviewed, using the image data acquisition system, based on the filtered inspection results of the next wafer and historical analysis sampling. The filtered inspection results of the next wafer are classified, using the processor, based on the reviewed locations of interest on the next wafer. The classified filtered inspection results for the next wafer are stored in the central storage media. The defect classifier is updated, using the processor, based on the stored classified filtered inspection results for the next wafer in the central storage media. Defects of interest in the next wafer are identified based on the classified filtered inspection results for the next wafer.

The image data acquisition system can be an SEM review tool.

The wafer inspection tool can perform a hot scan to capture inspection results. For example, the wafer inspection tool can be a broadband plasma inspection tool.

The defect classifier can send defect of interest data and nuisance data for retraining of the defect classifier.

The step of identifying defects of interest can comprise: sampling near a classification boundary of a most recent defect classifier; obtaining information about classifier stability based on fluctuations in the defect classifier; observing a movement in the classification boundary; and identifying the defects of interest based on the predicted movement in the classification boundary.

For each of the remaining wafers, the method can comprise updating the defect classifier, using the processor, based on the stored classified filtered inspection results for the next wafer in the central storage media. The filtering step can be performed based on the updated defect classifier.

The inspection results or reviewed locations of interest can be stored in the central storage media.

The step of updating the defect classifier based on the stored classified filtered inspection results in the central storage media can comprise: estimating a cap rate based on a calculated training confusion matrix and estimating a nuisance rate based on the defect classifier in the central storage media, the classified filtered inspection results for the next wafer, and the estimated cap rate. The calculated training confusion matrix is based on the stored classified filtered inspection results for the next wafer in the central storage media.

The filtered inspection results can have at least two thresholds associated with the filtered inspection results. A first of the at least two thresholds is for an inspection used for monitoring processes and defects. A second of the at least two thresholds is less than the first threshold and is configured to capture sub-threshold defects during inspection.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 1:
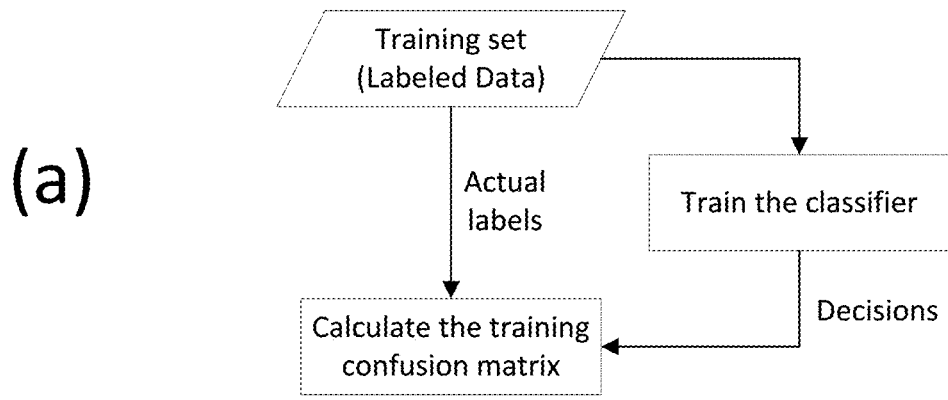
FIG. 1 includes flowcharts (a) and (b) of previous techniques.
Figure 1:
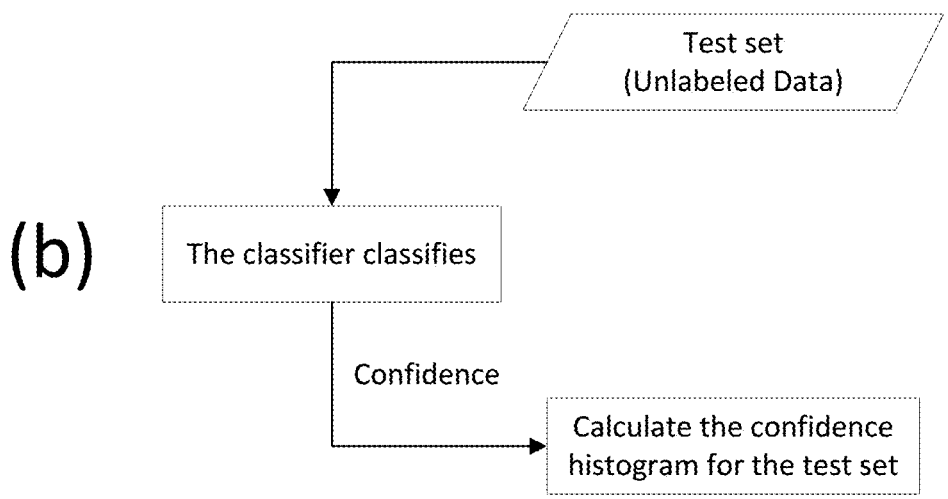

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The embodiments disclosed herein address new systems and methods for dealing with process and wafer instability in the early stages of an integrated circuit manufacturing process. One embodiment of the present disclosure is based on the idea of producing a small sample on productions lots in addition to the production sampling, aggregating the sample over several wafers to build an up-to-date classifier, and using classifier to produce new updated samples on the next wafer.

The embodiments disclosed herein may be particularly advantageous over existing methods for at least the following reasons. The presently disclosed systems and methods utilize a supplemental (augmented) sample which is generated using the latest known process conditions and is well-suited for returning a superior classifier. The latest known process conditions and defects are far more useful for this purpose than the random samples currently used.

The latest known process conditions are also a superior indication of process change, and any new defects or defects that show the largest variation will show up efficiently in the sample. In other words, an efficient incremental discovery with a small sample size leads to smaller additional SEM review and classification costs.

Furthermore, with additional monitoring of the process instability, and the ability of the presently disclosed systems and methods to quantify that process instability, the supplemental sample can be automatically tuned to match those process conditions.

Generally, disclosed systems and methods allow for more relevant broadband plasma inspection with more stable nuisance rate and DOI capture rates. The disclosed systems and methods allow for faster discovery of newly appearing defects occurring during the manufacturing process, and allow for an analysis of the stability of the manufacturing process.

There are several ways to implement the presently disclosed systems and methods. One embodiment relies solely on data from the central storage media and the systems and methods leverage the manual classification of defects in the classifier performance on the rest of the inspection. These embodiments cause the classifier to be one wafer behind what is currently being inspected. Another embodiment adds the ability to update the classifier on the current wafer by performing sampling on the wafer defect review tool and then producing the supplemental sample the central storage media. One advantage of this embodiments is that the latest wafer condition is also included in the classifier.

The cap rate and the nuisance rate can be estimated for the data where the actual labels are not available. Thus, the expected values for the cap rate and the nuisance rate can be provided. The techniques show that all the estimations of cap rate, nuisance rate, posteriors, and confidence are accurate or that the data has the shadowed distribution. Data produced by algorithms (in addition to classification) can provide diagnostics information that is not available with manually created classifiers such as inline defect organizer (iDO). iDO is an example of an algorithm that can classify defects in real-time during inspection.

A recipe can be assessed. These methods include estimation of the cap rate; estimation of the nuisance rate; evaluating the receiver operating curve (ROC), which can show cap rate versus nuisance rate, for fine tuning the recipe; and detecting the shadowing effect, which determines if the estimation of the posteriori, confidence, cap rate and nuisance rate are trustworthy. The ROC can be a curve that plots true positive rate versus false positive rate. Instead of or in collaboration with the ROC, DOI cap rate (true positive rate) versus nuisance rate (which is not false positive rate) may be used.

Two outputs from the classifier can be used to build the diagnostic tools. First, decisions, which are the classification results provided by the classifier, can be used. Second, posteriors for each defect can be used. There are different ways that a classifier might find posteriors. Distance from each class centroid or probabilistic measures of accuracy are two examples.

To estimate the cap rate, the ratio of the number of the DOIs that are correctly classified to the total number of DOIs in the training set can be used. This can be applied to the test set to find the estimation of the number of the DOI potentially missed in the test data. Assuming that there are two classes (DOI and nuisance), the confusion matrix appears as shown in Table 1.

TABLE 1

| ADC | Manual | |
|---|---|---|
| | DOI | Nuisance |
| DOI | $S_{DD}$ | $S_{DN}$ |
| Nuisance | $S_{ND}$ | $S_{NN}$ |

$S_{nm}$ is the set of all defects that originally belongs to class m and classified as class n. $S_{DD}$ is the set of defects that are classified as DOI and are actually DOI. $S_{ND}$ is the set of defects that are classified as nuisance and are actually DOI. $S_{DN}$ is the set of defects that are classified as DOI and are actually nuisance. $S_{NN}$ is the set of defects that are classified as nuisance and are also actually nuisance. The cap rate estimation for the entire wafer is shown in Equation 1.

$$\text{Cap rate} = \frac{|S_{DD}|}{|S_{DD}| + |S_{ND}|} \quad \text{Eq. 1}$$

In Equation 1, |S| denotes the size (cardinality) of set S. To estimate the nuisance rate of unlabeled defects, a ratio of the accumulative posteriors of the defects associated to nuisance for the defects that are classified as DOI to the total number of defects in the DOI bin can be used. Assuming two classes (DOI and nuisance), the after classification of the population of the data for the test data (or any unlabeled data) is shown in Table 2.

TABLE 2

| ADC | |
|---|---|
| DOI | $S_D$ |
| Nuisance | $S_N$ |

$S_D$ is the set of defects that are classified as DOI. $S_N$ is the set of defects that are classified as nuisance. Assuming the posterior for the nuisance class associated to defect i is $p_i$, the nuisance rate would be calculated as shown in Equation 2.

$$\text{Nuisance rate} = \frac{\sum_{i \in S_D} p_i}{|S_D|} \quad \text{Eq. 2}$$

$S_D$ is the set of defects that are classified as DOI. $p_i$ is the posterior probability for the nuisance class associated to defect i. $|S_D|$ denotes the size of set SD.

Figure 2:
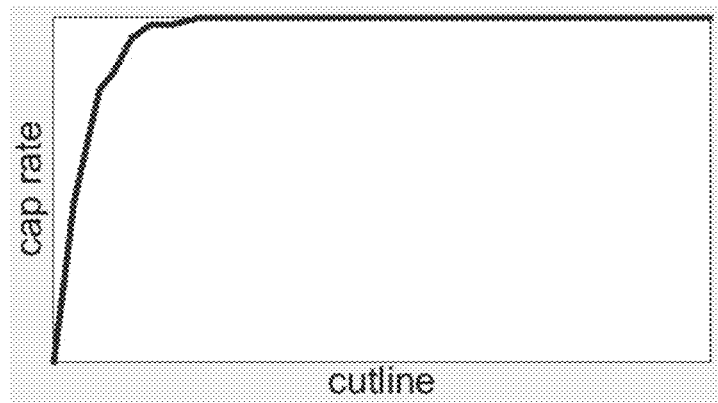
FIG. 2 includes charts (a), (b), and (c) of a cap rate versus cutline curve, a nuisance rate versus cutline curve, and a cap rate versus nuisance rate curve, respectively.
Figure 2:
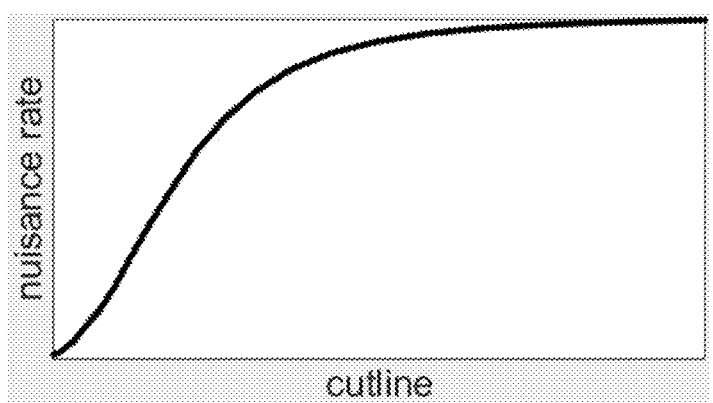
Figure 2:
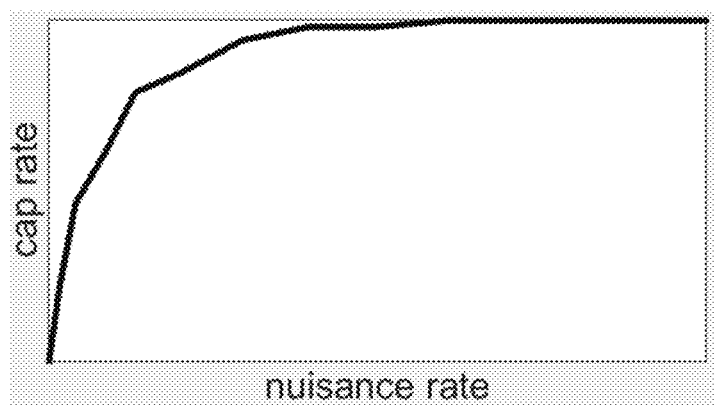

The cap rate can be increased with higher nuisance. This can be done by, for example, moving the cut lines in the confidence histogram and changing the class codes of the defects with lower confidence. The cap rate and nuisance rate can be evaluated for all the possible values of the cutline. Then the three plots can be shown, three examples of which are shown in FIG. 2. Chart (a) in FIG. 2 shows cap rate versus cutline value. Chart (b) in FIG. 2 shows nuisance rate versus cutline value. Chart (c) in FIG. 2 shows ROC. An ROC can be a useful representation of the performance of a classifier on a given data set. The user can find what is going to be the nuisance rate for a desired capture rate, and vice versa. With these curves, a user can decide if the values of cutline worthwhile.

Figure 3:
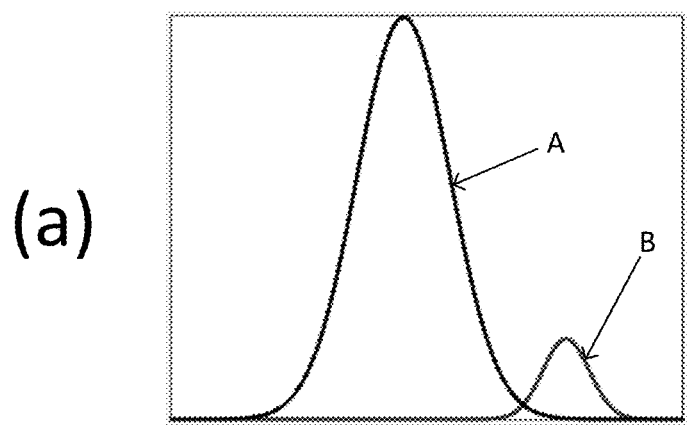
FIG. 3 includes distributions (a), (b), and (c)
Figure 3:
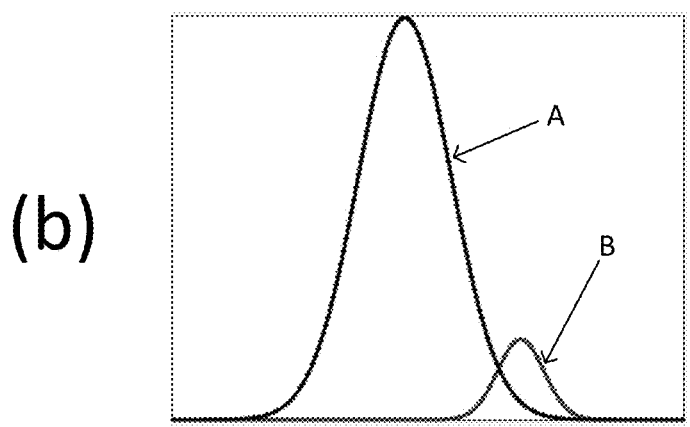
Figure 3:
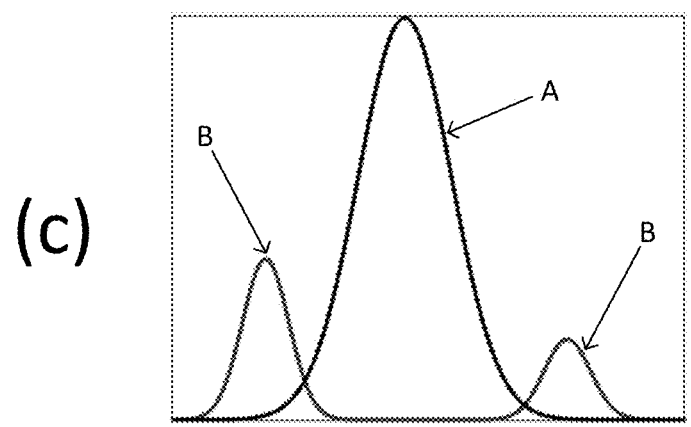

In classification, well-separated distributions may be the ones with short overlap as shown in FIGS. 3(a), (b), and (c). Data can be well-separated as if a clear boundary can be draw between the two distributions as shown in FIGS. 3(a) and (b). Distributions can be well-separated and have multiple regions in the space and be separated using multiple boundaries as shown in FIG. 3(c).

Most classifiers can learn this situation. In this scenario, the performance of the classifier is ordinary. Such Probability Density Functions (PDFs) are the ones that normally appears in the wafer, but this is not always the case. A big part of one distribution may have been shadowed. Shadowing effect is a situation when a large part of one class distribution is under the PDF of another class. This situation can happen as mistakes during manual or automated labeling or as a result of not having good attributes to distinguish the shadowed part from the other class. Charts (a) and (b) in FIG. 4 are two examples of this situation.

Figure 4:
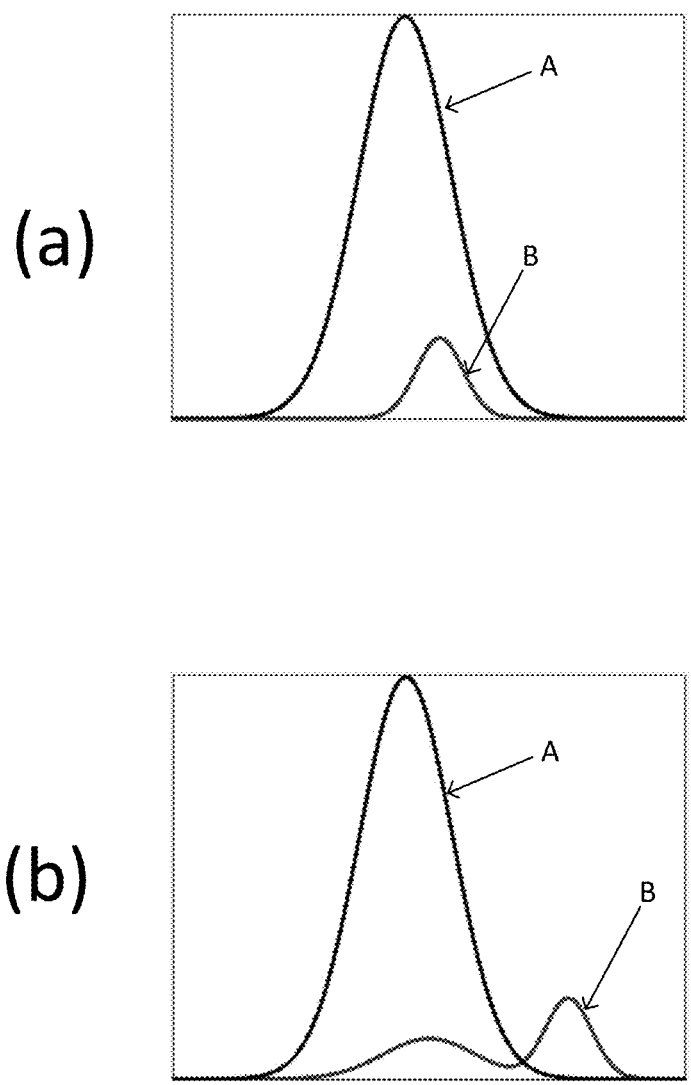
FIG. 4 includes distributions (a) and (b)

The detection of the first case ((a) in FIG. 4) is relatively easy because, just by observing the training confusion matrix, it can be determined that the accuracy for one class is poor. Detecting the second case ((b) in FIG. 4) is more difficult. This situation can mislead a user about the data on the wafer where big portion of one class will not be detected, no matter what kind of the classifier is used. The misclassification here is not due to the poor performance of the classifier, but may be due to the poor quality of features or labeling.

Figure 5:
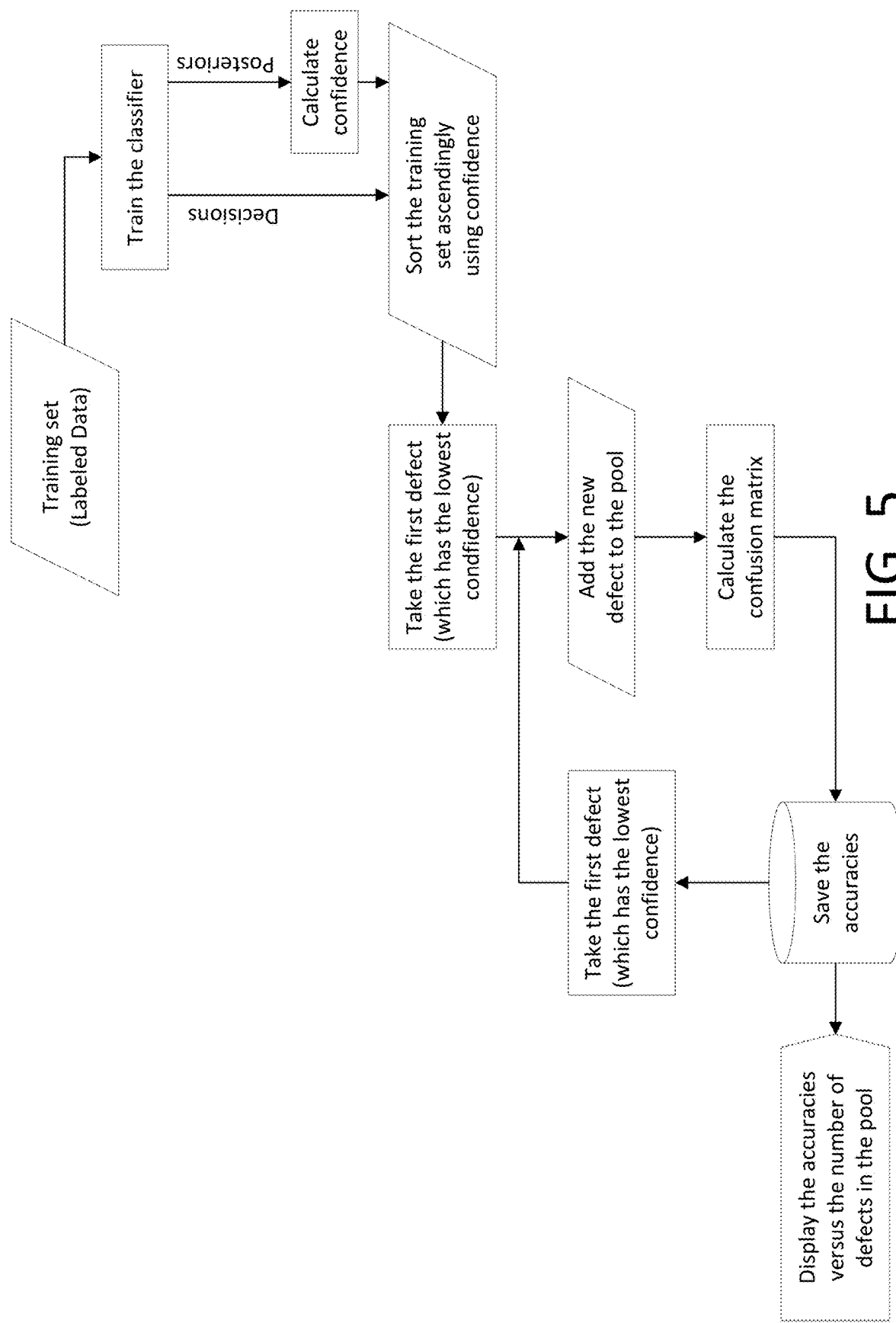
FIG. 5 is a flowchart of an embodiment of a shadow detect algorithm in accordance with the present disclosure.

To detect this situation, a classifier can be trained with the training set. Then, the training can be sorted to set ascendingly from the confidence values the defects obtained from the classifier. An empty pool can be created and defects can be added one by one from lowest confidence to highest confidence to the pool. After adding each defect, the confusion matrix of the defects in the pool can be calculated and the accuracies of the classes and the number of defects in the pool can be saved. Accuracy for each class can be defined as the number of correctly classified defects of that class to the total number of defects from that class. After using all the defects in the training set, the accuracies versus the number of defects in the pool can be compared. An example of this algorithm is shown in FIG. 5.

For an ordinary defect distribution on a wafer, the accuracy of all of the classes in the pool is expected to increase or stay constant when the number of defects is increased. While other rationales are possible, a new defect in the pool may have greater than or equal confidence in comparison to the previous defects in the pool.

Figure 6:
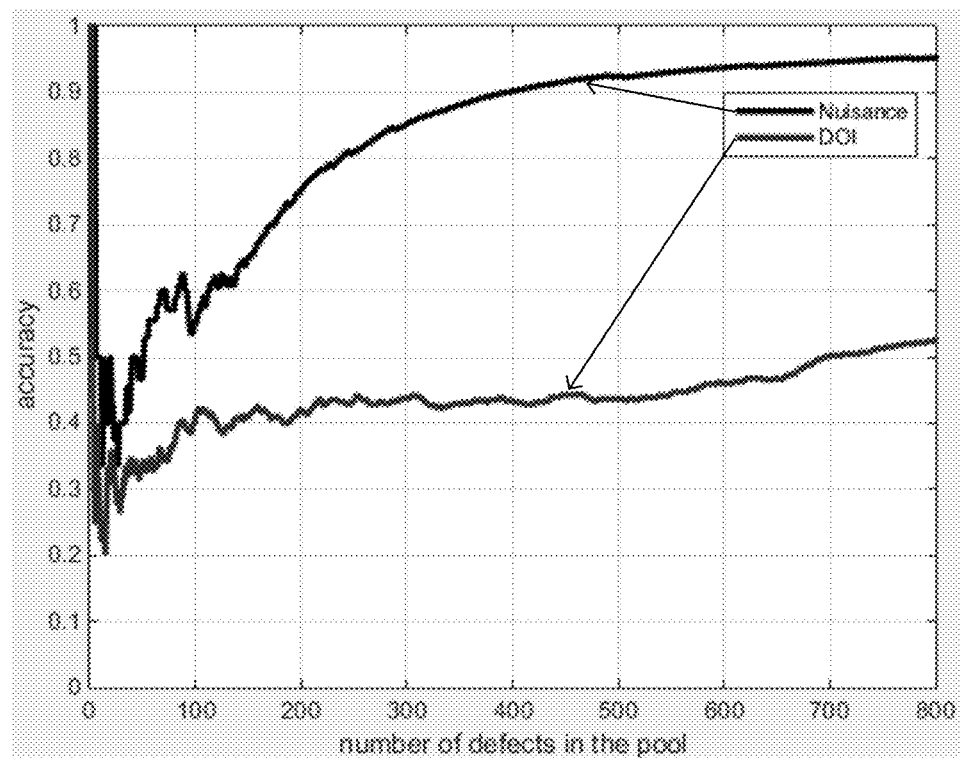
FIG. 6 includes charts of accuracy versus number of defects in the pool for an ordinary wafer (a) and a shadowed wafer (b)
Figure 6:
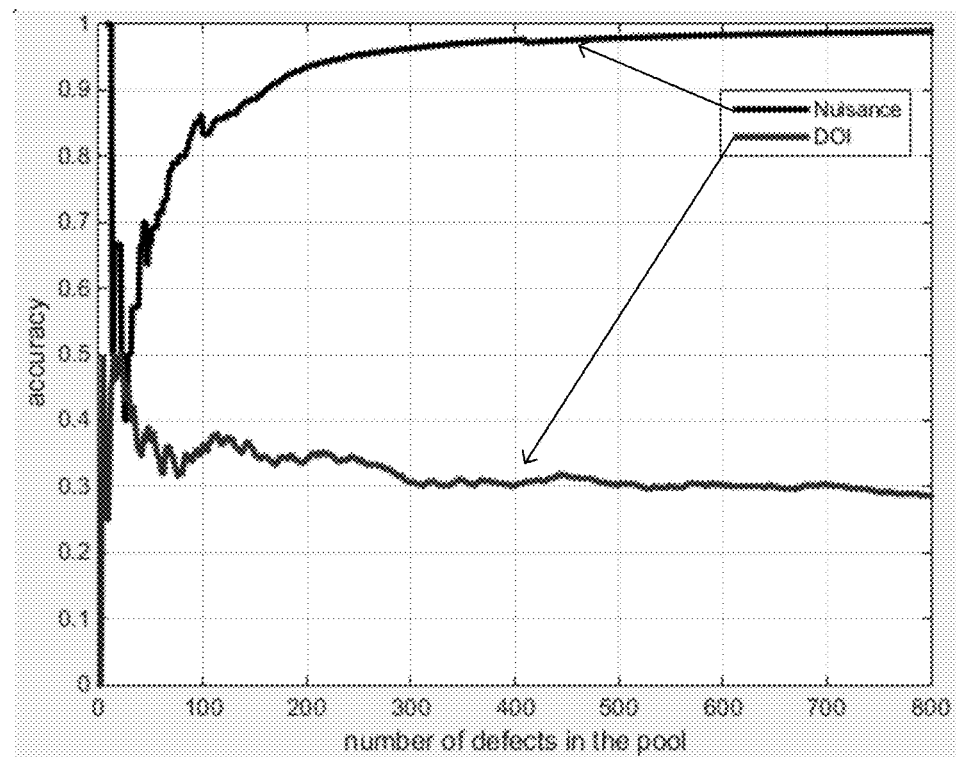

The plots in (a) and (b) in FIG. 6 show this for two different wafers. The plot in (a) of FIG. 6 is from a wafer without shadowed DOI and both DOI and nuisance accuracies improve with the number of defects. However, the plot (b) in FIG. 6 shows a wafer which a DOI class observes a shadowing effect. The DOI bin does not improve with the number of defects. It indicates that high confidence defect are added, but these are being classified incorrectly, which is an indication of the shadowing effect.

Figure 7:
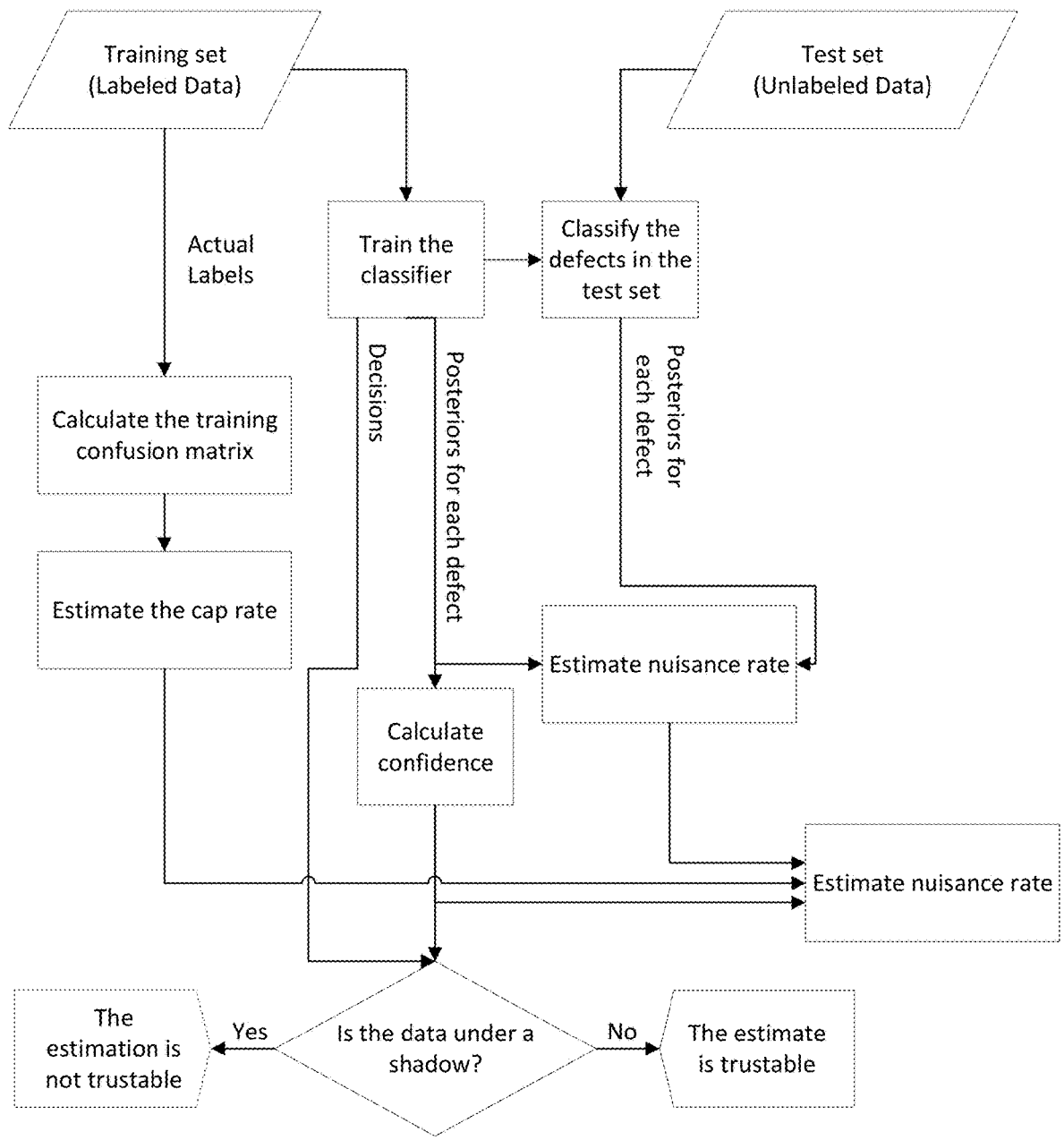
FIG. 7 is a flowchart of an embodiment of a diagnostic model in accordance with the present disclosure.

The details of an embodiment of a method are shown in the flowchart of FIG. 7. FIG. 7 shows a flow chart for the algorithm of estimating nuisance rate and capture rate and detection of the shadow effect. The training set is used to create the classifier. The classifier is applied to the defects in the test set. Then, the classifier is used to evaluate the confidence and posteriors for all the defects (both in the training set and test set). The estimation of the nuisance rate is done using the posteriors. The estimation of the capture rate is done using the confusion matrix obtained from the training set. Finally, a check is done to find out if the data is under the shadow effect or not. If it is not, then the estimates are trustable.

Figure 8:
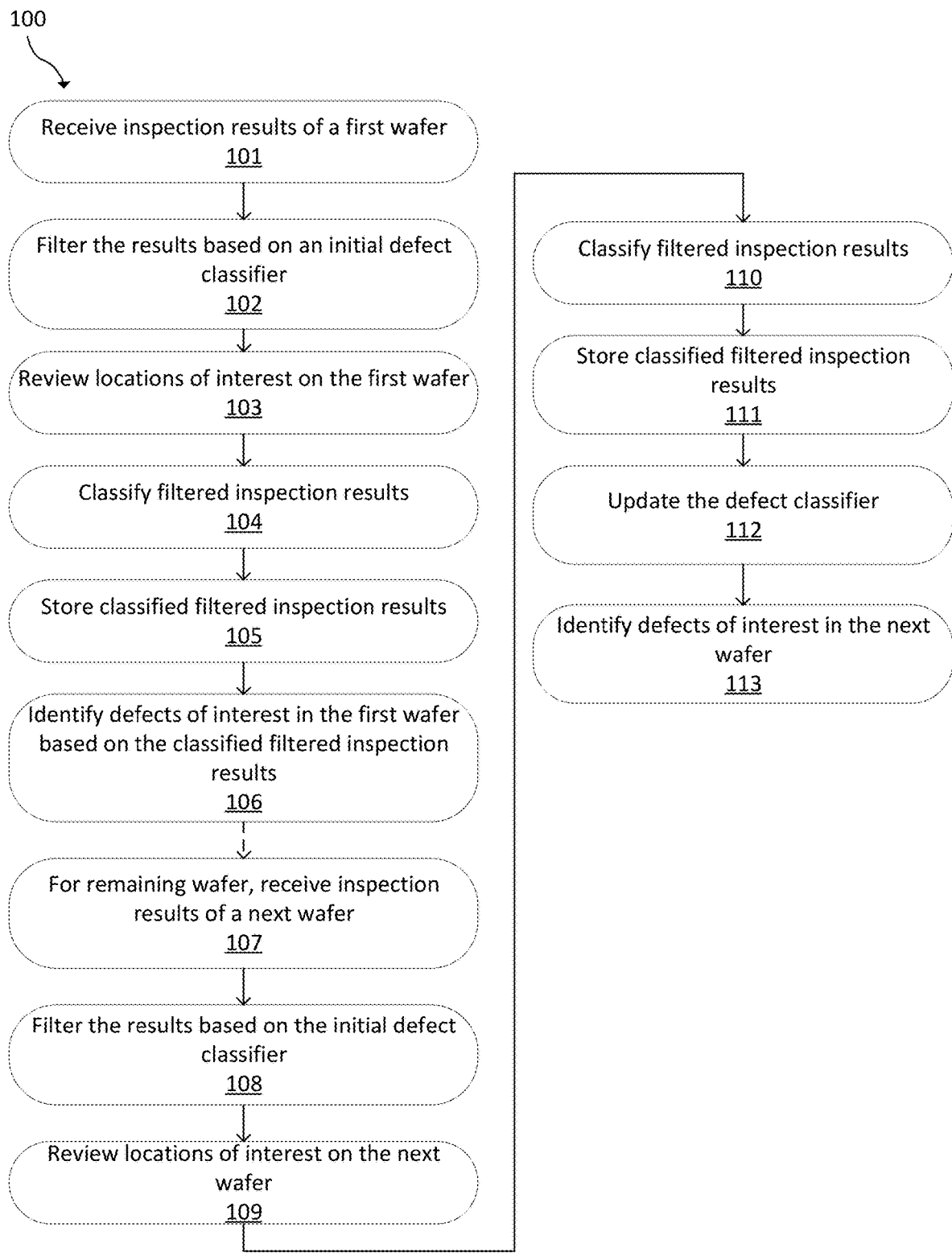
FIG. 8 is a flowchart of an embodiment in accordance with the present disclosure.

FIG. 8 is a flowchart of a method 100 for identifying defects of interest in a plurality of wafers. At 101, inspection results of a first wafer are received, such as at a processor, from a wafer inspection tool, which may be a BBP tool or another inspection device. At 102, the inspection results are filtered based on an initial defect classifier, such as using the processor. At 103, locations of interest on the first wafer are reviewed based on the filtered inspection results, such as using an image data acquisition system. The image data acquisition system may be an SEM review tool or another measurement, inspection, or metrology tool. At 104, the filtered inspection results are classified, such as using the processor, based on the reviewed locations of interest on the first wafer. At 105, the classified inspection results are stored in a central storage media. At 106, defects of interest are identified based on the classified filtered inspection results, such as using the processor. Filtered inspection results may be kept separate, such as for each wafer that is sampled.

For each remaining wafer, inspection results of the next wafer are received, such as at the processes, from the wafer inspection tool at 107. The inspection results are filtered based on the initial defect classifier, such as using the processor at 108. At 109, locations of interest on the next wafer are reviewed, such as using the image data acquisition system, based on the filtered inspection results and historical analysis sampling. At 110, the filtered inspection results are classified, such as using the processor, based on the reviewed locations of interest on the next wafer. At 111, the classified filtered results are stored in the central storage media. At 112, the defect classifier is updated, such as using the processor, based on the stored classified results in the central storage media. At 113, defects of interest in the next wafer are identified, such as using the processor, based on the classified filtered inspection results for the next wafer.

Next wafer can refer to the next sequential wafer, but also can mean a second, third, fourth, fifth or later wafer.

In the method 100, identifying defects of interest can include sampling near a classification boundary of a most recent defect classifier. Information can be obtained about classifier stability based on fluctuations in the defect classifier. Movement of the classification boundary can be predicted. Defects of interest can be identified based on the predicted movement in the classification boundary.

The wafer inspection tool may perform a hot scan to capture inspection results using the method 100.

The defect classifier may send defect of interest data and nuisance data to be used for retraining of the defect classifier.

For each remaining wafer, the defect classifier can be updated, such as using the processor, based on the stored classified results in the central storage media. The filtering step may be performed based on the updated defect classifier.

Inspection results or reviewed locations of interest can be stored in the central storage media.

Updating the defect classifier based on the stored classified results in the central storage media can include estimating a cap rate based on a calculated training confusion matrix. The calculated training confusion matrix may be based on the stored classified filtered inspection results for the next wafer in the central storage media. A nuisance rate can be estimated based on the defect classifier in the central storage media, the classified filtered inspection results for the next wafer, and the estimated cap rate. These steps may be performed by the processor.

A confidence value also can be calculated based on the initial defect classifier. In this instance, updating the defect classifier based on the stored classified results in the central storage media further can further include detecting a shadowing effect based on the defect classifier and the calculated confidence value.

The filtered inspection results can have at least two thresholds associated with the filtered inspection results. A first of the at least two thresholds is for an inspection may be used for monitoring processes and defects. A second of the at least two thresholds is less than the first threshold and may be configured to capture sub-threshold defects during inspection. This enables sampling on both sides of the threshold to allow changing the classification boundary in both directions.

This technique provides multiple advantages. It provides a fast cap rate estimator. Normally, the estimation of the cap rate is an expensive and/or inaccurate task. A user must sample a huge number of defects from a nuisance bin, review them with a tool (e.g., a SEM tool), classify them, and try to come up with an estimate of the number of DOI in the nuisance bin. This method is not feasible most of the time because the number of defects in the DOI bin is extremely large. Embodiments disclosed herein do not need any sample, which makes it extremely fast. A faster nuisance rate estimation is also provided. Normally to estimate the nuisance rate, the users randomly sample from the DOI bin and then SEM review them, and classify them. This extra time for sampling, SEM reviewing, and classification can be removed using techniques disclosed herein.

The estimate of the ROC curve on the entire wafer can be a helpful tool for the semiconductor manufacturers to tune the recipe and to identify the optimal conditions for the inspection given the desired outcome.

The disclosed techniques also provide a detection method for shadowing effect. Inseparable parts of the distribution in the data can be identified. This phenomenon normally happens due to the mistakes during manual labeling, poor SEM image quality, or lack of strong features.

Figure 9:
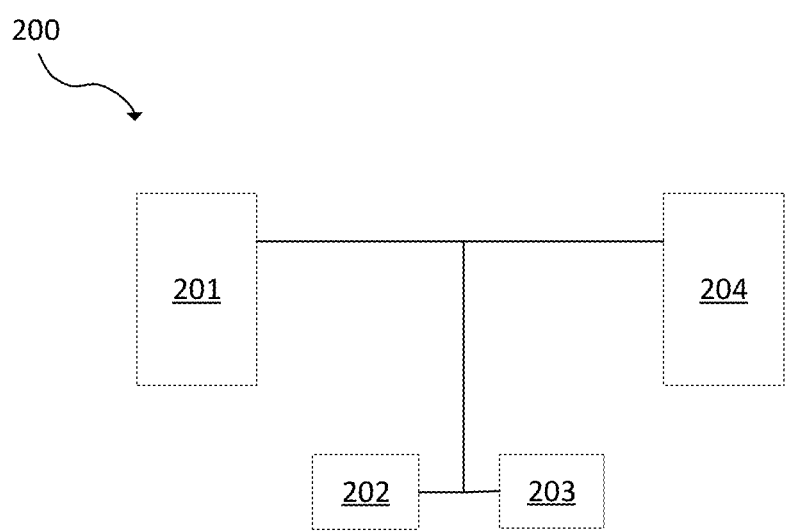
FIG. 9 is a block diagram of a system in accordance with the present disclosure.

FIG. 9 is a block diagram of a system 200 for detecting defects of interest in a plurality of wafers. The system 200 includes a wafer inspection tool 201, an image data acquisition system 204, a central storage media 203, and a processor 202. The image data acquisition system 204 may be an SEM review tool. The wafer inspection tool 201 may be a BBP inspection tool, which can be configured to perform a hot scan to capture inspection results. The wafer inspection tool 201 also may be an LS tool or an unpatterned wafer surface inspection system, such as the Surfscan SPx manufactured by KLA-Tencor Corporation. The central storage media 203 is configured to store a plurality of classified inspection results and an initial defect classifier. The processor 202 is in electronic communication with the central storage media 203, the wafer inspection tool 201, and the image data acquisition system 204.

The processor 202 is configured to execute the instructions of an inspection engine, a sampling engine, and a tuning engine. The inspection engine instructs the processor to receive inspection results of a first wafer from the wafer inspection tool. The sampling engine instructs the processor to: retrieve the initial defect classifier from the central storage media; filter the inspection results based on the initial defect classifier; review locations of interest on the first wafer from the image data acquisition system based on the filtered inspection results; classify the filtered inspection results based on the initial defect classifier; store the classified filtered inspection results in the central storage media; and identify defects of interest in the first wafer based on the classified filtered inspection results. The tuning engine instructs the processor to update the initial defect classifier based on the stored classified results in the central storage media.

For each remaining wafer, the inspection engine instructs the processor to: receive inspection results of a next wafer from the wafer inspection tool. The sampling engine instructs the processor to: filter the inspection results based on the initial defect classifier; review locations of interest on the next wafer, using the image data acquisition system, based on the filtered inspection results and historical analysis sampling; classify the filtered inspection results based on the reviewed locations of interest on the next wafer; store the classified results in the central storage media; update the defect classifier, using the processor, based on the stored classified results in the central storage media; and identify defects of interest in the next wafer based on the classified filtered inspection results for the next wafer.

For each remaining wafer, the tuning engine can instruct the processor to update the defect classifier, using the processor, based on the stored classified results in the central storage media. The sampling engine can instruct the processor to perform the filtering step based on the updated defect classifier. The number of results or number of wafers used to update the defect classifier may be decided by the algorithm and can be controlled by setup. These numbers may depend on the use case and on the inspections. For research and development applications, only a few most recent wafers might be used. In a more mature high volume manufacturing process, the training data could come from more wafers. It may be time-bound and data-sufficiency bound.

The defect classifier can send defect of interest data and nuisance data to be used for retraining of the defect classifier.

The step of identifying defects of interest can include sampling near a classification boundary of a most recent defect classifier; obtaining information about classifier stability based on fluctuations in the defect classifier; observing a movement in the classification boundary; and identifying defects of interest based on the predicted movement in the classification boundary. Observing a movement may be performed on some of the most recent wafers.

The inspection results or reviewed locations of interest can be stored in the central storage media 203, which may include a database. In a particular instance, a central storage media 203 can store the classified defects along with the rest of the inspection population. A tuning and analysis engine can operate on the stored data after each new data is added to the database. A sampling engine can retrieve the latest classifier from the central server to identify the most suitable defects. This is done by one or more of the following techniques. First, leveraging the latest classifier to sample near the classification boundaries of the model (as both sides of the boundary). Second, using the information about classifier stability obtained from the classification fluctuations on recent wafers. Third, directing most of the sample to the side of the classification boundary that is most likely be in the direction of the boundary move.

Figure 10:
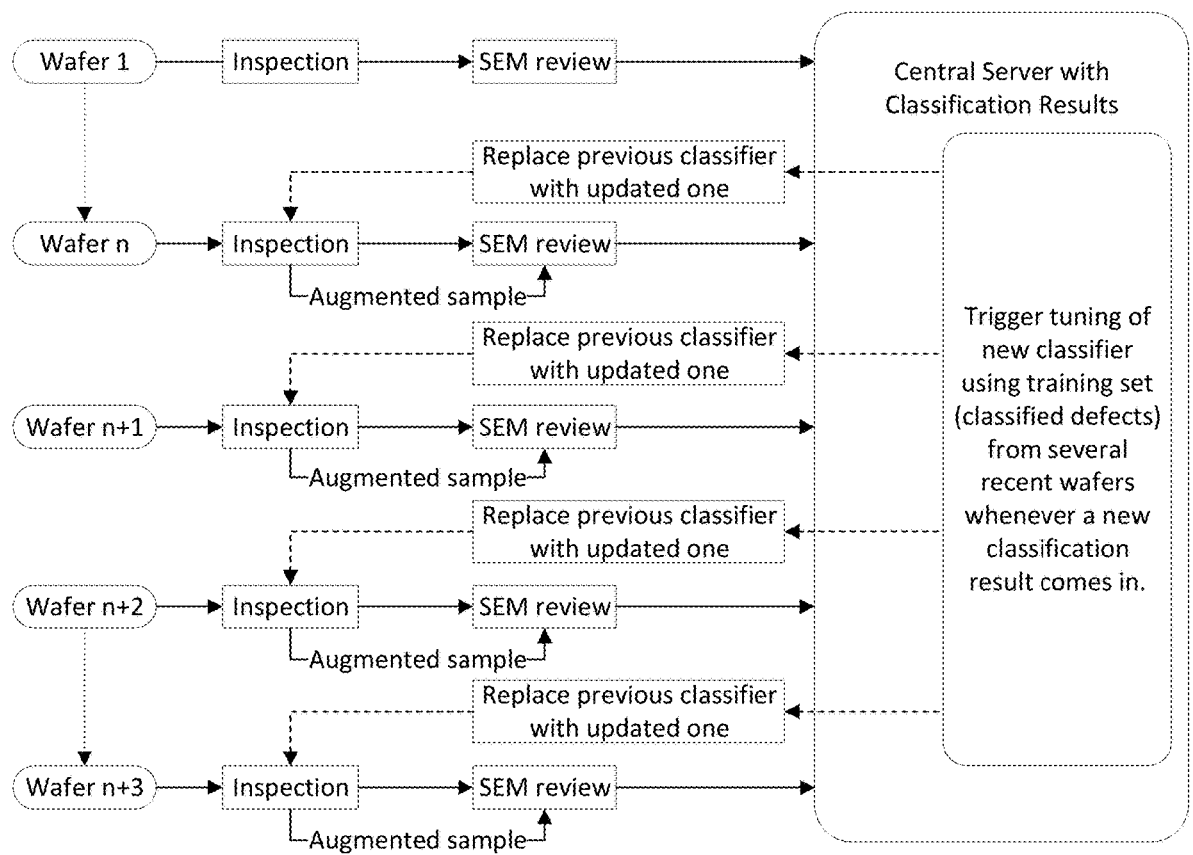
FIG. 10 is a diagram of a dynamic classifier with dynamic sampling and stability analysis in accordance with the present disclosure.
Figure 11:
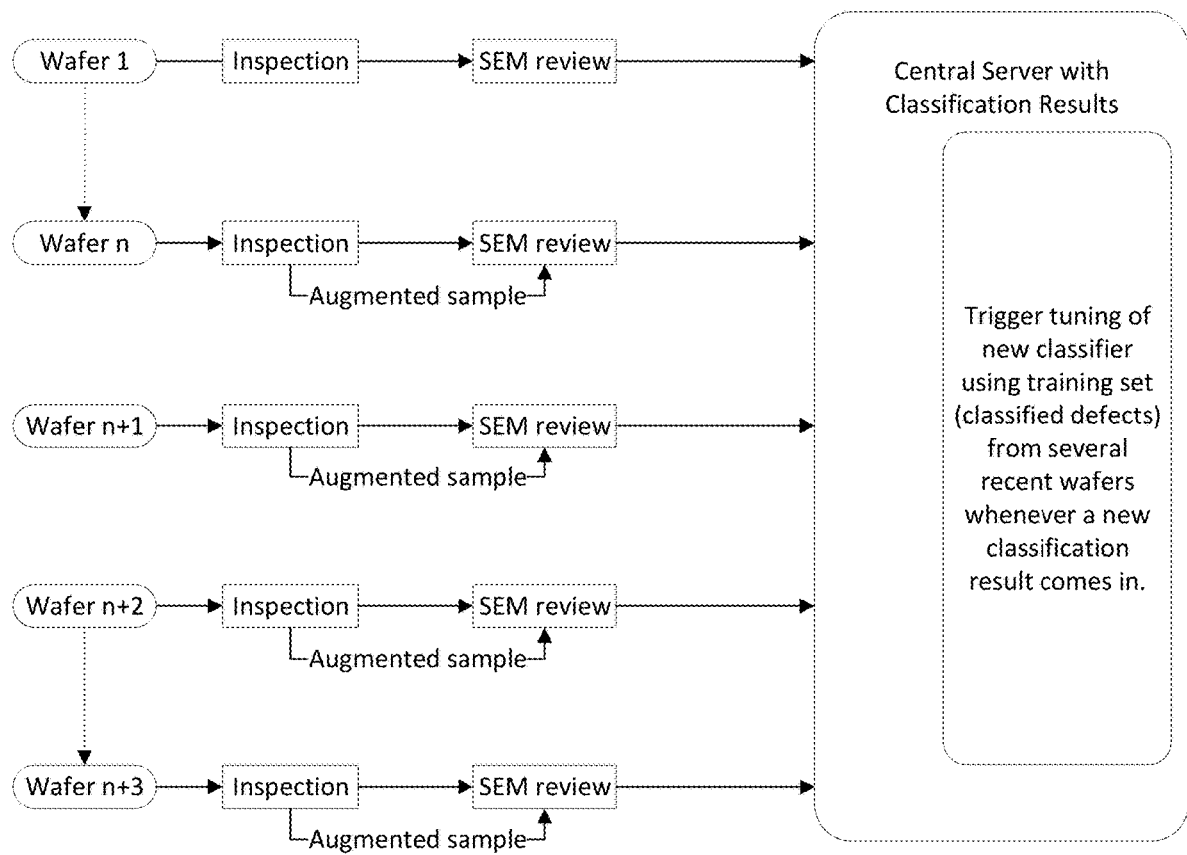
FIG. 11 is a diagram of a static classifier with dynamic sampling and stability analysis in accordance with the present disclosure.

One embodiment relies solely on the central storage media 203 and leverages the manual classification of defects and the classifier performance on the rest of the inspection. This construction keeps the classifier one wafer behind. Another embodiment adds the ability to update the model on the current wafer by performing sampling on the wafer defect review tool and then producing the supplemental sample for central storage, which means that the latest wafer condition is also included. Two examples are shown in FIGS. 10 and 11. In FIGS. 10 and 11, inspection is run hotter with a nuisance-DOI classifier playing the role of a standard nuisance filter. This retains defects on both sides of the nuisance-DOI boundary for retraining. Stability information from historical analysis sampling setup and the latest classifier is used for sampling.

While the processor 202 and central storage media 203 are illustrated as separate, these may be part of the same control unit. Both the processor 202 and central storage media 203 may be part of the wafer inspection tool 201 or the image data acquisition system 204, or another device. In an example, the processor 202 may be a standalone control unit or in a centralized quality control unit. Multiple processors 202 and/or central storage media 203 may be used. For example three processors 202 may be used for the inspection engine, sampling engine, and tuning engine.

The processor 202 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 202 to implement various methods and functions may be stored in controller readable storage media, such as a memory in the central storage media 203 or other memory.

The processor 202 and central storage media 203 may be coupled to the components of the system 200 in any suitable manner (e.g., via one or more transmission media, which may include wired and/or wireless transmission media) such that the processor 202 and central storage media 203 can receive the output generated by the system 200. The processor 202 may be configured to perform a number of functions using the output.

The processor 202 and central storage media 203, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high speed processing and software, either as a standalone or a networked tool.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

An additional embodiment relates to a non-transitory computer-readable medium storing program instructions executable on a controller for performing a computer-implemented method of an embodiment disclosed herein. In particular, the processor 202 can be coupled to a memory in the central storage media 203 or other electronic data storage medium with non-transitory computer-readable medium that includes program instructions executable on the processor 202. The computer-implemented method may include any step(s) of any method(s) described herein. For example, the processor 202 may be programmed to perform some or all of the steps of FIG. 8. The memory in the central storage media 203 or other electronic data storage medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes (MFC), SSE (Streaming SIMD Extension), or other technologies or methodologies, as desired.

Each of the steps of the method may be performed as described herein. The methods also may include any other step(s) that can be performed by the controller and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the spirit and scope of the present disclosure. Hence, the present disclosure is deemed limited only by the appended claims and the reasonable interpretation thereof.

What is claimed is:

1. A system for detecting defects of interest in a plurality of wafers comprising:
   a central storage media configured to store a plurality of classified inspection results and an initial defect classifier;
   a wafer inspection tool;
   an image data acquisition system; and
   a processor in electronic communication with the central storage media, the wafer inspection tool, and the image data acquisition system, the processor configured to execute the instructions of:
      an inspection engine which instructs the processor to:
         receive inspection results of a first wafer from the wafer inspection tool;
      a sampling engine which instructs the processor to:
         retrieve the initial defect classifier from the central storage media;
         filter the inspection results based on the initial defect classifier;
         review locations of interest on the first wafer from the image data acquisition system, based on the filtered inspection results;
         classify the filtered inspection results based on the initial defect classifier;
         store the classified filtered inspection results in the central storage media; and
         identify defects of interest in the first wafer based on the classified filtered inspection results, wherein the step of identifying defects of interest comprises:
            sampling on both sides of a classification boundary between the defects of interest and nuisance of a most recent defect classifier;
            obtaining information about classifier stability based on classification fluctuations in the most recent defect classifier;
            observing a movement in the classification boundary using the most recent defect classifier; and
            identifying the defects of interest based on the predicted movement in the classification boundary, wherein the predicted movement is a probable direction of the movement in the classification boundary;
      a tuning engine which instructs the processor to:
         update the initial defect classifier based on the stored classified filtered inspection results in the central storage media;
      wherein for each remaining wafer:
         the inspection engine instructs the processor to:
            receive inspection results of a next wafer from the wafer inspection tool;
         the sampling engine instructs the processor to:
            filter the inspection results of the next wafer based on the initial defect classifier;
            review locations of interest on the next wafer, using the image data acquisition system based on the filtered inspection results of the next wafer and historical analysis sampling;
            classify the filtered inspection results of the next wafer based on the reviewed locations of interest on the next wafer;
            store the classified filtered inspection results for the next wafer in the central storage media;
            update the defect classifier, using the processor, based on the stored classified filtered inspection results for the next wafer in the central storage media; and
            identify defects of interest in the next wafer based on the classified filtered inspection results for the next wafer.

2. The system of claim 1, wherein, for each of the remaining wafers:
   the tuning engine instructs the processor to:
      update the defect classifier, using the processor, based on the stored classified filtered inspection results for the next wafer in the central storage media;
   wherein the sampling engine instructs the processor to perform the filtering step based on the updated defect classifier.

3. The system of claim 1, wherein the image data acquisition system is a scanning electron microscope review tool.

4. The system of claim 1, wherein the wafer inspection tool performs a hot scan to capture inspection results.

5. The system of claim 1, wherein the defect classifier sends defect of interest data and nuisance data for retraining of the defect classifier.

6. The system of claim 1, further comprising storing the inspection results or reviewed locations of interest in the central storage media.

7. The system of claim 1, wherein the wafer inspection tool is a broadband plasma inspection tool.

8. A method for identifying defects of interest in a plurality of wafers comprising:
   receiving, at a processor, inspection results of a first wafer from a wafer inspection tool;
   filtering, using the processor, the inspection results based on an initial defect classifier;
   reviewing locations of interest on the first wafer, using an image data acquisition system, based on the filtered inspection results;
   classifying the filtered inspection results, using the processor, based on the reviewed locations of interest on the first wafer;

storing the classified filtered inspection results in a central storage media;

identifying defects of interest in the first wafer based on the classified filtered inspection results, wherein the step of identifying defects of interest comprises:

sampling on both sides of a classification boundary between the defects of interest and nuisance of a most recent defect classifier;

obtaining information about classifier stability based on classification fluctuations in the most recent defect classifier;

observing a movement in the classification boundary using the most recent defect classifier; and identifying the defects of interest based on the predicted movement in the classification boundary, wherein the predicted movement is a probable direction of the movement in the classification boundary; and for each remaining wafer:

receiving, at the processor, inspection results of a next wafer from the wafer inspection tool;

filtering, using the processor, the inspection results based on the initial defect classifier;

reviewing locations of interest on the next wafer, using the image data acquisition system, based on the filtered inspection results of the next wafer and historical analysis sampling;

classifying the filtered inspection results of the next wafer, using the processor, based on the reviewed locations of interest on the next wafer;

storing the classified filtered inspection results for the next wafer in the central storage media;

updating the defect classifier, using the processor, based on the stored classified filtered inspection results for the next wafer in the central storage media; and identifying defects of interest in the next wafer based on the classified filtered inspection results for the next wafer.

9. The method of claim 8, wherein the image data acquisition system is a scanning electron microscope review tool.

10. The method of claim 8, wherein the wafer inspection tool performs a hot scan to capture inspection results.

11. The method of claim 8, wherein the defect classifier sends defect of interest data and nuisance data for retraining of the defect classifier.

12. The method of claim 8, further comprising, for each of the remaining wafers:

updating the defect classifier, using the processor, based on the stored classified filtered inspection results for the next wafer in the central storage media;

wherein the filtering step is performed based on the updated defect classifier.

13. The method of claim 8, further comprising storing the inspection results or reviewed locations of interest in the central storage media.

14. The method of claim 8, wherein the wafer inspection tool is a broadband plasma inspection tool.

15. The method of claim 8, wherein the step of updating the defect classifier based on the stored classified filtered inspection results in the central storage media comprises:

estimating a cap rate based on a calculated training confusion matrix, wherein the calculated training confusion matrix is based on the stored classified filtered inspection results for the next wafer in the central storage media; and estimating a nuisance rate based on the defect classifier in the central storage media, the classified filtered inspection results for the next wafer, and the estimated cap rate.

16. The method of claim 15, wherein the filtered inspection results have at least two thresholds associated with the filtered inspection results, wherein a first of the at least two thresholds is for an inspection used for monitoring processes and defects, and wherein a second of the at least two thresholds is less than the first threshold and is configured to capture sub-threshold defects during inspection.

17. The method of claim 8, wherein the step of updating the defect classifier based on the stored classified filtered inspection results in the central storage media comprises detecting a shadowing effect based on the defect classifier and a calculated confidence value based on the initial defect classifier.

* * * * *